United States Patent [19]

Schmitt

[11] Patent Number: 5,369,359
[45] Date of Patent: Nov. 29, 1994

[54] PARTICLE BEAM TESTING METHOD WITH COUNTERVOLTAGE OR RETARDING VOLTAGE FOLLOW-UP OR FEEDBACK

[75] Inventor: Reinhold Schmitt, Munich, Germany

[73] Assignee: Siemens Aktiengesellschaft, Munich, Germany

[21] Appl. No.: 947,520

[22] Filed: Sep. 21, 1992

[30] Foreign Application Priority Data

Nov. 5, 1991 [DE] Germany .................. 4136407

[51] Int. Cl.⁵ ............................. G01R 1/04
[52] U.S. Cl. ................. 324/158.1; 324/73.1; 250/310; 250/311
[58] Field of Search ............ 324/158 R, 73 R, 158 F; 250/310, 311

[56] References Cited

U.S. PATENT DOCUMENTS

| | | | |
|---|---|---|---|
| 4,554,455 | 11/1985 | Todokoro et al. | 250/305 |
| 4,629,889 | 12/1986 | Todokoro et al. | 250/310 |
| 4,712,057 | 12/1987 | Pau | 324/73 R |
| 4,912,052 | 3/1990 | Miyoshi et al. | 324/158 R |
| 5,030,908 | 7/1991 | Miyoshi et al. | 324/158 R |

FOREIGN PATENT DOCUMENTS 3941178 6/1991 European Pat. Off. .

OTHER PUBLICATIONS

Proceedings of SPIE, International Society of Optical Engineering, Mar. 11-12, 1986, Santa Clara, U.S.A., vol. 632, pp. 232-236.

"An Open-Loop Spectrocopy for Quantitative Waveform Measurements with the Scanning Electron Microscope", J. Phys. E. Sci. Instrum., vol. 18; 1985, printed in Great Britain, pp. 284-285.

Primary Examiner—Louis Arana
Assistant Examiner—Barry C. Bowser
Attorney, Agent, or Firm—Hill, Steadman & Simpson

[57] ABSTRACT

A particle beam testing method wherein with the assistance of at least one adjustment voltage, an actual specimen voltage boost is produced at a measuring point of a specimen and wherein a reference specimen voltage boost for the measuring point is supplied to a retarding field, and as a result, the actual specimen voltage boost corresponds to the reference specimen voltage boost of the measuring point and, thus, a detector current remains constant so long as the specimen is fault-free.

17 Claims, 3 Drawing Sheets

PARTICLE BEAM TESTING METHOD WITH COUNTERVOLTAGE OR RETARDING VOLTAGE FOLLOW-UP OR FEEDBACK

BACKGROUND OF THE INVENTION

The present invention is generally directed to particle beam testing methods. More specifically, the invention is directed to a particle beam testing method wherein a detector is used to detect secondary electrons emitted from a specimen and to generate a detector current that in turn is used to generate a retarding voltage or countervoltage that is then fed back to a field placed in the path of the secondary electrons as a result of which an electrical characteristic of the specimen can be obtained.

A particle beam testing method of this type is described in an article by Furakawa et al., published in the proceedings of SPIE—The International Society of Optical Engineering, Vol. 632, Electron-Beam, X-Ray & Ion-Beam Techniques for Sub-Micrometer Lithographies V, Mar. 11-12, 1986, pp. 232-236 and entitled "Quantitative voltage measurement by a software closed loop technique in electron beam testing." In this article, there is described an electron beam testing method for quantitative measurement of a specimen utilizing a software closed loop technique. For example, a control loop is used to feed-back a retarding voltage or countervoltage to a retarding electrode such that a detector current becomes identical to a prescribed reference current and such that there is a linear relationship between a specimen voltage to be measured and the set retarding voltage or countervoltage. The teachings of that article are incorporated herein by reference.

In pertinent part, the article describes that the software closed loop technique is used for quantitative voltage measurement and electron beam testing for LSI's. In that regard, the retarding voltage of an energy analyzer is controlled iteratively by a computer to reduce difference between a slice level and a secondary electron signal to 0. The voltage is determined by the retarding voltage at the cross-point of the slice level and the energy distribution curve.

As acknowledged in that article, it takes a long time, typically several minutes, to obtain a voltage wave form with an energy analyzer, if an energy distribution curve is required for every sampling phase. Typically, in hardware closed loop techniques, complex feedback circuits are required and these lack flexibility for correcting the influence of beam intensity drift and specimen contamination.

In another article by Fujioka et al., entitled "An open-loop spectroscopy for quantitative waveform measurements with the scanning electron microscope" published in Vol. 18 in the Journal of Physics and Education Science Instrumentation, pp. 284-285 (1984), there is described another method for quantitative measurements employing another particle beam testing method. The teachings of that article are incorporated herein by reference.

As described in that article, a retarding field energy analyzer system is provided for quantitative wave form measurement which uses no feedback loop. The system is controlled with a minicomputer to allow sampling and storing of retarding curves (S-curves) at each stroboscopic sampling phase.

By reading the retarding voltages at an arbitrarily specified traverse position or slice level of the spectrometer or S-curves, according to the authors, one can get a quantitative relation between the specimen voltage and the sampling phase.

SUMMARY OF THE INVENTION

The present invention provides a particle beam testing method and apparatus particularly suited for fast qualitative tests, having a maximum testing sensitivity and that is relatively easy to implement. To this end, the invention provides that a specimen to be tested is supplied with an adjustment voltage (also referred to as a test or input voltage) so as to generate a specimen boost voltage (i.e., a change in the electrical potential of the specimen under test), a retarding field is provided with a retarding voltage that is equal to the summation of a reference specimen boost voltage and a basic retarding voltage, and a detector current remains constant so long as the specimen boost voltage is equal to the reference specimen boost voltage, faults in the specimen being detected by analyzing variations in the detector current.

In an embodiment, the invention provides a particle beam testing method having the following steps:

providing a specimen to be tested;

supplying a portion of the specimen with an adjustment voltage (i.e., test or input voltage);

generating a specimen boost voltage (i.e., change in the electrical potential of the specimen under test) at a test point of the specimen;

generating a reference specimen boost voltage;

generating a base retarding voltage;

generating a retarding voltage equal to the summation of the reference specimen boost voltage and the base retarding voltage;

providing a retarding voltage field;

supplying the retarding voltage to the retarding voltage field;

directing a particle beam onto the specimen test point;

causing secondary electrons to be emitted from the test point;

attracting the secondary electrons to the retarding voltage electrode;

detecting electrons attracted to the retarding voltage electrode; and generating a detector current dependent on the specimen boost voltage, the detector current remaining constant so long as the specimen boost voltage and reference specimen boost voltage are equal regardless of variations in the adjustment voltage.

In an embodiment, the invention provides that the particle beam is an electron beam.

In an embodiment, the invention provides that the particle beam comprises an ion beam.

In an embodiment, the invention provides that the particle beam is an x-ray beam.

In an embodiment, the invention provides that the particle beam is a laser beam.

In an embodiment, the invention provides that the retarding voltage field is an electrode.

In an embodiment, the invention provides that the retarding voltage electrode comprises a slotted sheet of metal.

In an embodiment, the invention provides that the method comprises the further steps of:

providing a second field between the specimen test point and the retarding voltage field such that the second field is at least partially impinged by the particle beam;

generating a base main voltage;

generating a main voltage equal to the summation of a base main voltage and the reference specimen boost voltage; and supplying the main voltage to the second electrode.

In an embodiment, the invention provides that the second field is an electrode.

In an embodiment, the invention provides that the second field electrode is a slotted sheet of metal.

An advantage that can be obtained with the method of the invention is that no broadband limiting element such as, for example, gain controlled amplifiers, etc., are required for the implementation of the method and as a result, a relatively high processing speed can be achieved.

These and other features of the invention will become clear below with reference to the following detailed description of the presently preferred embodiments and the accompanying drawings.

DETAILED DESCRIPTION OF THE PRESENTLY PREFERRED EMBODIMENTS

Figure 1:
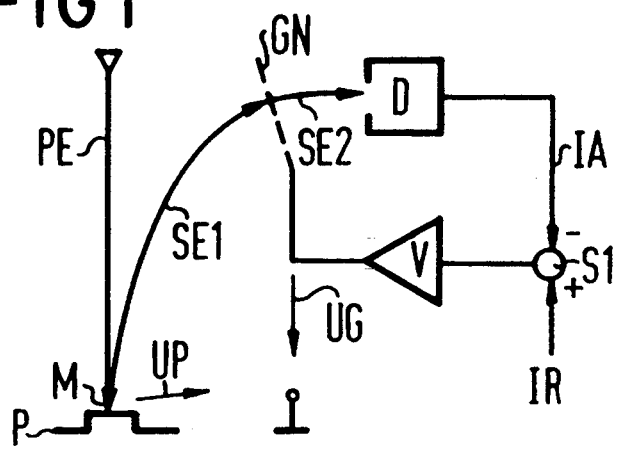
FIG. 1 illustrates a circuit diagram of an arrangement for the implementation of a prior art particle beam testing method.

In FIG. 1 there is illustrated a circuit arrangement for implementing a known prior art particle beam testing method with a feedback loop for providing a retarding voltage or counter voltage. In the illustrated method, a primary electron beam PE is directed onto a test point M of a specimen P, for example, a transistor in a large scale integrated (LSI) circuit. A stream of secondary electrons SE1 is caused to be emitted from the test point M to a retarding or opposing field network GN and one portion SE2 of the secondary electron stream SEI reaches a detector D.

In response to the detection of the secondary electrons SE2, the detector D generates a detector current IA. The detector current IA is then supplied to a summation point S1 where it is summed or otherwise compared with a reference current IR. The result of the summation is supplied to an amplifier V which generates a retarding voltage or countervoltage UG which is supplied, or otherwise fedback, to the retarding field network GN.

What is involved is, therefore, a control circuit that feeds back the retarding voltage UG at the retarding field network GN such that the detector current IA always corresponds to the prescribed reference current IR for all specimen voltages UP. This is similar to the hardware arrangement referred to in the above-mentioned article by Furukawa et al.

Figure 2:
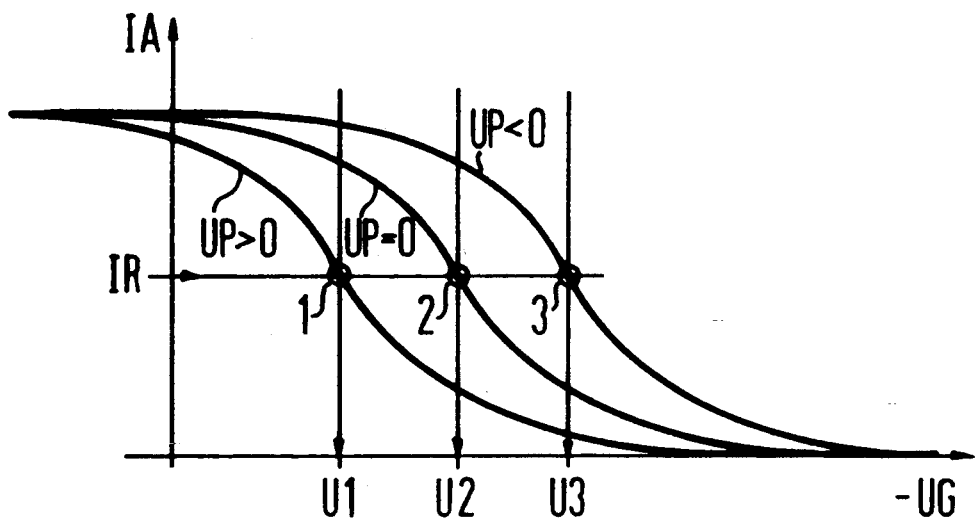
FIG. 2 illustrates a diagram of spectrometer characteristics relating to the arrangement of FIG. 1.

In FIG. 2 there is illustrated a diagram of spectrometer characteristics relating to the circuit of FIG. 1. As can be seen in FIG. 2, the detector current IA is plotted against a negative retarding voltage $-UG$ and respective spectrometer characteristic curves can be plotted on this graph. In FIG. 2, spectrometer characteristic curves are illustrated for three cases wherein the specimen voltage UP is greater than 0, equal to 0, and less than 0.

As illustrated, for a given detector current, the spectrometer characteristic curves occur at different positions along the retarding voltage axis, depending on the specimen voltage UP. When the detector current IA is equal to the reference current IR, the spectrometer characteristics shift along the retarding voltage axis only by a respective boost of the specimen voltage. As a result, there is a linear relationship between the respective boost of the retarding voltage and the respective boost of the specimen voltage.

It can be seen then that the reference current IR and the spectrometer characteristics for the specimen voltage UP greater than 0 thereby form an operating point 1 that leads to the retarding voltage $-UG=U1$. In a corresponding way, the spectrometer characteristic for the specimen voltage $UP=0$ forms the operating point 2 and leads to the retarding voltage $-UG=U2$ and the spectrometer characteristic for the specimen voltage UP less than 0 leads to an operating point 3 and to a retarding voltage $-UG=U3$. It is apparent therefore that the retarding voltage thereby becomes all the more negative the more the negative the specimen voltage UP becomes. Due to the linear relationship between the specimen voltage boost and the retarding voltage boost, the known particle beam testing method can be utilized particularly well for quantitative tests but does have a relatively low processing speed due to the control circuit that is required.

Particularly when structures having a plurality of relatively simply and identically constructed elements such as, for example, LCD point matrix displays or DRAMs, are not only to be tested for their functionability but are to be tested relatively fast, for example $10^6$ elements in 30 seconds, the known method set forth above can only be realized or implemented with a relatively high technological outlay, if at all.

Although the particle beam testing method of the invention has a retarding voltage or countervoltage feedback or follow-up in order, for example, to obtain the respective maximum testing sensitivity for different specimen voltages, it manages to do so without a control circuit that limits processing speed since the method of the invention is directed to a qualitative testing method—functional or faulty—and a linear relationship between the specimen voltage boost and the retarding voltage or countervoltage boost is not required.

Figure 3:
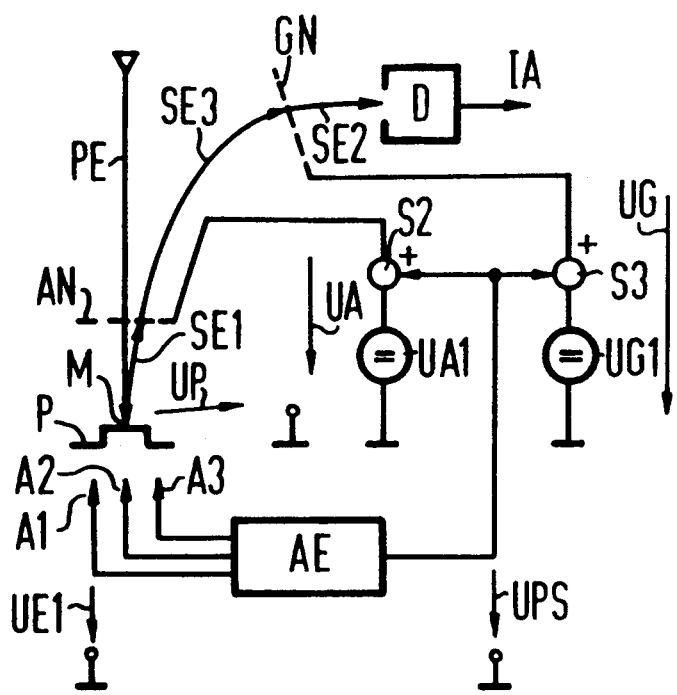
FIG. 3 illustrates a circuit diagram of an arrangement for the implementation of a method embodying principles of the invention.

In FIG. 3 there is illustrated a circuit diagram of an arrangement for the implementation of a particle beam testing method embodying principles of the invention. As can be seen, in a step similar to that illustrated in FIG. 1, a primary electron beam PE is directed onto a measuring or test point M of a specimen P to generate a stream of secondary electrons SE1. A potentially necessary, further field network AN, for example an extraction network, can be provided positioned relative closely above the specimen P such that it is impinged by a portion of the primary electron beam PE and by a portion of the stream of secondary electrons SE1. A portion of the secondary electrons SE1 that has passed through the further network is referenced SE3 and reaches the retarding or opposing field network GN. A portion of the secondary electrons SE3 that passes through the retarding or opposing field network GN is referenced SE2 and, as already set forth with reference to FIG. 1, generates a detector current IA in the detector D.

Given, for example, that the specimen P has drive terminals A1 ... A3 that can be selectively driven by a drive unit AE, an adjustment voltage (or test or input voltage) UE1 can be applied, by way of example, to the terminal A1. A retarding voltage or countervoltage UG is supplied to the retarding or opposing field network GN, this retarding or countervoltage UG being generated at a summation point S3 from a base retarding voltage or countervoltage UG1 and from a reference specimen voltage boost UPS that also can be generated by the drive unit AE. In a corresponding way, a mains voltage US can be generated at a summation point S2 from a base mains voltage (i.e., reference change in the electrical potential of the specimen) UA1 and the reference specimen boost voltage UPS and may be applied to the further network AN. The specimen voltage UP lies between the measuring or test point M of the specimen P and a reference potential as a consequence of the application of adjustment voltages (i.e., test or input voltages), for example the adjustment voltage UE1 to the specimen.

Figure 4:
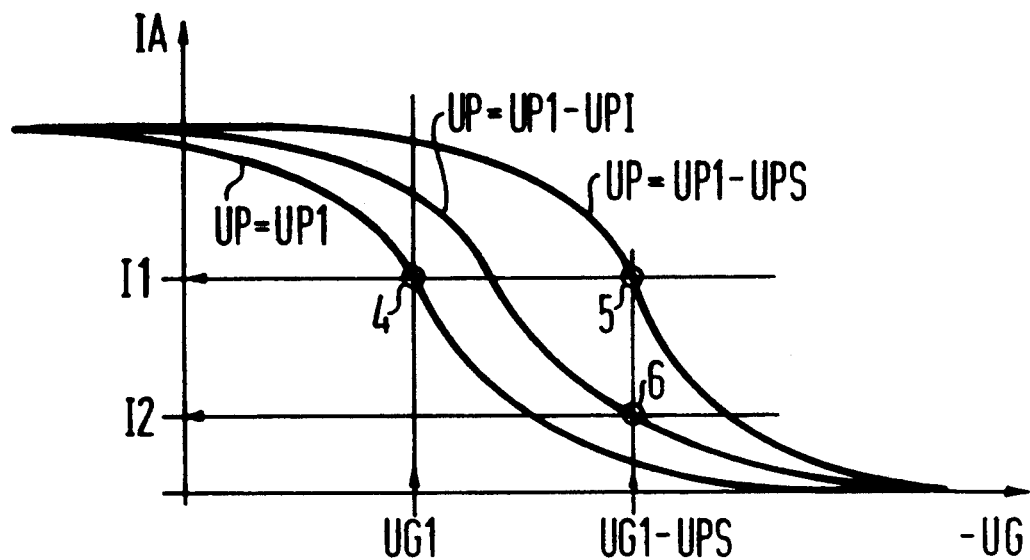
FIG. 4 illustrates a diagram of spectrometer characteristics relating to the circuit of FIG. 3.

In FIG. 4, there is illustrated a diagram of spectrometer characteristics relating to the arrangement of FIG. 3. As illustrated, the detector current IA is plotted against a negative retarding voltage or countervoltage $-UG$ and a first spectrometer characteristic curve for a specimen voltage $UP=UPI$, a second spectrometer characteristic curve for a specimen voltage $UP=UP1-UPS$, and a third spectrometer characteristic curve for a specimen voltage $UP=UP1-UPI$ are plotted on the graph. UP1 is a base specimen voltage that, for example, can be equal to 0, UPI is an actual specimen voltage boost (i.e., actual change in the electrical potential of the specimen) that occurs in the case of a malfunction or a faulty specimen, and UPS is a reference specimen voltage boost (i.e., reference change in the electrical potential of the specimen).

In the case where the reference specimen voltage boost UPS is equal to 0 and, thus, the specimen UP voltage is equal to the base specimen voltage UP1, the relative retarding voltage or countervoltage UG corresponds to the base retarding voltage or countervoltage UG1. With reference to the first spectrometer characteristic curve for the specimen voltage $UP=UP1$, the base retarding voltage or countervoltage UG1 forms a reference detector current I1 at an operating point 4.

When the specimen P is fault-free, the specimen voltage UP at the measuring or test point M is composed of the base specimen voltage UP1 and of the reference specimen voltage boost UPS, then the first spectrometer characteristic curve for $UP=UP1$ is shifted only along the direction of the UG axis, as shown in FIG. 2, since the base retarding voltage or countervoltage UG1 at the summation point S3 is likewise exactly superimposed on the reference specimen voltage boost UPS. The result is that the detector current IA always corresponds to the reference detector current I1 insofar as the specimen voltage boost UPI at the measuring or test point M corresponds to the respective reference specimen voltage boost UPS for the measuring point M.

In FIG. 4, thus, the retarding voltage or countervoltage $UG=UG1-UPS$ together with the second spectrometer characteristic curve for $UP=UP1-UPS$ likewise leads the detector current IA being equal to the reference detector current I1 at the operating point 5. Advantageously, the operating point 4 and, thus, the operating point 5 are selected such that they respectively represent the points having the greatest steepness of the respective spectrometer characteristic curve since a maximum measuring sensitivity is or, respectively, maximum voltage boosts are thereby possible.

When given a faulty specimen P, the specimen voltage UP, for example, does not become as greatly negative as in the fault-free case, and, thus, the actual specimen voltage boost UPI is smaller in amount than a reference specimen voltage boost UPS. Then the energy of the secondary electrons SE1 is not as greatly increased as in the fault-free case and the first spectrometer characteristic curve of the base specimen voltage UP1 does not shift as greatly along the direction of the negative retarding voltage or countervoltage $-UG$ as in the fault-free case. Since, however, the negative retarding voltage or countervoltage $-UG$ in case of a faulty specimen also is formed or generated from the base countervoltage UG1 and from the reference specimen voltage boost UPS generated by the drive unit AE, the secondary electrons SE3 are identically decelerated to the same extent by the respectively same retarding or opposing field of the retarding or opposing network GN in both instances. The energy of the secondary electrons SE1 in the case of a faulty specimen, however, is lower and a detector current I2 that is lower than the reference detector current I1 arises given a faulty specimen. For example, as illustrated in FIG. 4, the detector current I2 arises at an operating point 6 for a negative retarding voltage or countervoltage $-UG=UG1-UPS$ and on the third spectrometer characteristic for $UP=UP1-UPI$. Depending on the type of fault, the detector current I2 of a faulty specimen can be greater than or lower than the reference detector current I1.

When the at least one further network AN is situated between the measuring or test point M and the retarding or opposing field network GN, as illustrated in FIG. 3, and is partially impinged by the primary electron beam PE, the voltage between the measuring or test point M and the respective, further network AN optimally must be independent of changes in the specimen voltage UP, i.e., from the specimen voltage boost, so that a falsification of the detector current IA is not incurred. When, as shown in FIG. 3, the reference specimen voltage boost UPS is superimposed on a respective base mains voltage UA1, a falsification of the detector current can be avoided in the case of a faultless specimen and can be reduced in the case of a faulty specimen.

In the most complicated case, the drive unit AE can be constructed to supply a different adjustment voltage vector for each of the terminals A1 ... A3 and respectively different reference voltage boosts UPS for every measuring or test point M. One possible manner in which to accomplish this is, for example, to utilize a memory of a computer (in which are stored appropriate voltages in digital form) to which a plurality of D/A converters can be coupled, each converter coupled to a terminal so that upon activation it will supply a different voltage signal to its assigned specimen terminal.

Further, a functional specimen can be introduced into the drive unit AE, this forming the reference specimen voltage boost UPS for every measuring or test point that corresponds to a respective adjustment voltage vector.

However, an extremely simple drive unit AE' can be constructed for testing LCD point matrix displays since all elements of the LCD point matrix display can be simultaneously and identically activated or, respectively, driven, and the respective reference specimen voltage boost UPS is the same for every element, i.e., for every measuring or test point. Such a drive unit AE' is illustrated in FIG. 5.

Figure 5:
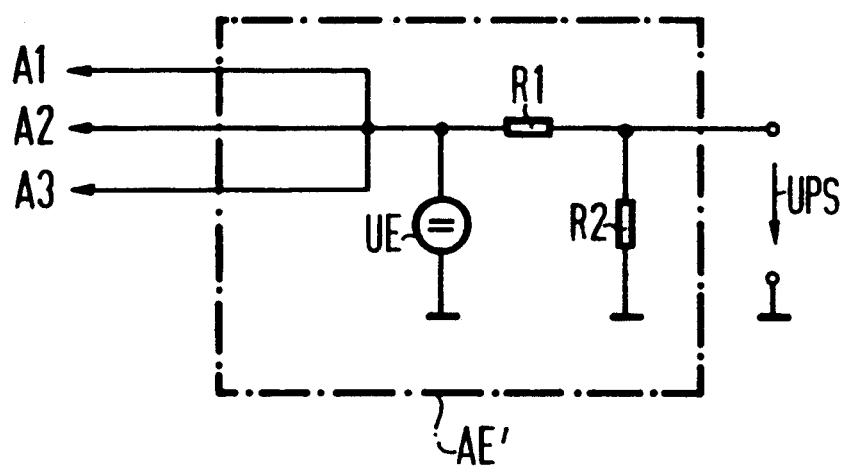
FIG. 5 illustrates a voltage driver unit that can be used in connection with the circuit of FIG. 3.

As illustrated in FIG. 5, in the unit AE', a DC voltage source UE is connected to a voltage divider composed, for example, of a resistor R1 and a resistor R2. The DC voltage source UE thereby simultaneously supplies the respective adjustment voltages for all drive terminals A1...A3 of the specimen P while a reference specimen voltage boost UPS (that is the same for all measuring points) is generated at the resistor R2 by the voltage divider.

As set forth above, the secondary electrons can be generated by particle beams other than an electron beam. In that regard, a primary particle beam can be provided in the form of an ion beam or a laser beam for generating secondary electrons.

Further, the further field or extraction network AN, the retarding or opposing field network GN, and other networks serving as electrodes can be replaced by corresponding electrodes constructed in the form of sheet metal having slot-shaped openings.

While preferred embodiments have been shown, modifications and changes may become apparent to those skilled in the art which shall fall within the spirit and scope of the invention. It is intended that such modifications and changes be covered by the attached claims.

What is claimed is:

1. A particle beam testing method, comprising the steps of:
   providing a specimen to be tested and a testing apparatus comprising a particle beam emitter, a detector, a retarding voltage field and a drive unit;
   positioning a retarding voltage electrode between the specimen and the detector;
   charging the retarding voltage electrode to a first potential;
   directing a particle beam onto a test point of the specimen, and thereby causing secondary electrons to be emitted from the specimen at the test point;
   detecting the secondary electrons with the detector and producing a first detector current thereat;
   generating an input voltage in the drive unit;
   applying to at least one portion of the specimen the input voltage and producing a change in potential at the test point;
   producing with the drive unit a reference change in potential anticipated at the test point due to proximity of the input voltage;
   superimposing the reference change in potential on the potential of the electrode;
   producing a second detector current after application of the input voltage to the specimen; and
   comparing the first and second detector currents, a faulty specimen being recognized when the first and second detector currents differ.

2. The method of claim 1, wherein the particle beam is an electron beam.

3. The method of claim 1, wherein the particle beam comprises an ion beam.

4. The method of claim 1, wherein the particle beam is an x-ray beam.

5. The method of claim 1, wherein the particle beam is a laser beam.

6. The method of claim 1, wherein the method comprises the further steps of:
   providing a second electrode between the specimen test point and the retarding voltage electrode;
   charging the source electrode to a third potential; and
   superimposing the reference change in potential on the third potential.

7. A particle beam testing system, comprising:
   a particle beam source for directing a particle beam onto a specimen to be tested and causing a stream of secondary electrons to be emitted from a test point of the specimen;
   a detector positioned to detect the stream of secondary electrons and to generate a detector current which varies directly relative to the secondary electrons detected;
   a base retarding voltage source;
   a reference specimen change in voltage source;
   a summation point at which the base retarding voltage and reference specimen change in voltage are summed to generate a retarding voltage;
   a retarding voltage filed electrode positioned between the specimen and the detector such that the stream of secondary electrons travels therethrough, the retarding voltage being applied to the retarding field electrode;
   a test voltage source coupled to selectively apply a test voltage to the specimen;
   whereby the detector current is dependent on an actual change in specimen voltage but remains constant so long as the actual change in specimen voltage and the reference specimen change in voltage are equal, regardless of variations in the test voltage, faulty specimens being recognized by variations in the detector current.

8. The particle beam testing system of claim 7, wherein the particle beam is an electron beam.

9. The particle beam testing system of claim 7, wherein the particle beam comprises an ion beam.

10. The particle beam testing system of claim 7, wherein the particle beam is an x-ray beam.

11. The particle beam testing system of claim 7, wherein the particle beam is a laser beam.

12. The particle beam testing system of claim 7, further comprising:
   a second electrode positioned between the test point and the retarding voltage field electrode such that the second electrode is at least partially impinged by the particle beam and at least partially impinged by the stream of electrons;
   a base mains voltage source;
   a second summation point at which the base mains voltage and the reference specimen change in voltage are summed to generate a mains voltage, the mains voltage being applied to the second field.

13. The particle beam testing system of claim 7, wherein the retarding voltage field is an electrode.

14. The particle beam testing system of claim 14, wherein the retarding voltage field electrode comprises a slotted sheet of metal.

15. The particle beam testing system of claim 13, wherein the second field comprises an electrode.

16. The particle beam testing system of claim 16, wherein the second field electrode comprises a slotted sheet of metal.

17. The particle beam testing system of claim 7, wherein the reference specimen boost voltage source and the adjustment voltage source comprise a single unit having a primary voltage source whose output is the adjustment voltage and a voltage divider network coupled to the primary voltage source, the output of the voltage divider being the reference specimen boost voltage.

* * * * *